US005648320A

United States Patent [19]

Jacobs

[11] Patent Number: 5,648,320
[45] Date of Patent: Jul. 15, 1997

[54] METHOD OF MANUFACTURING CERAMIC SUPERCONDUCTOR CIRCUIT BOARD

[76] Inventor: Richard L. Jacobs, 1630 Fiske Pl., Oxnard, Calif. 93030

[21] Appl. No.: 423,655

[22] Filed: Apr. 14, 1995

Related U.S. Application Data

[60] Division of Ser. No. 173,242, Dec. 23, 1993, Pat. No. 5,504,138, which is a continuation-in-part of Ser. No. 111,711, Aug. 25, 1993, Pat. No. 5,378,737, which is a continuation of Ser. No. 399,699, Aug. 28, 1989, abandoned, which is a continuation of Ser. No. 739,827, May 31, 1985, abandoned, and a continuation-in-part of Ser. No. 699,743, May 14, 1991, abandoned.

[51] Int. Cl.$^6$ .............................. H01L 39/24; B05D 3/02
[52] U.S. Cl. ...................... 505/471; 505/480; 505/220; 505/741; 427/62; 427/63
[58] Field of Search ................................ 505/471, 741, 505/480, 220; 427/62, 63, 96

[56] References Cited

U.S. PATENT DOCUMENTS

| | | | |
|---|---|---|---|
| 3,932,318 | 1/1976 | Sleight | 252/521 |
| 4,152,386 | 5/1979 | Winter | 505/802 |
| 4,671,854 | 6/1987 | Ishikawa et al. | 156/659.1 |
| 4,857,504 | 8/1989 | Hermann | 505/1 |
| 4,876,177 | 10/1989 | Akahoshi et al. | 430/313 |
| 4,933,317 | 6/1990 | Johnston | 505/1 |
| 4,942,152 | 7/1990 | Itozaki | 423/593 |
| 4,999,136 | 3/1991 | Su | 428/901 |
| 5,200,392 | 4/1993 | Rao et al. | 515/785 |
| 5,250,600 | 10/1993 | Nguyen | 578/362 |
| 5,332,869 | 7/1994 | Hagiwara | 174/257 |
| 5,356,755 | 10/1994 | Matsuda et al. | 430/313 |
| 5,378,737 | 1/1995 | Jacobs | 528/59 |
| 5,451,629 | 9/1995 | Jacobs | 528/60 |
| 5,504,138 | 4/1996 | Jacobs | 505/785 |

FOREIGN PATENT DOCUMENTS

| | | | |
|---|---|---|---|
| 1-200691 | 8/1989 | Japan | |
| 1271474 | 10/1989 | Japan | |
| 0304604 | 12/1989 | Japan | 505/785 |
| 1304604 | 12/1989 | Japan | |

OTHER PUBLICATIONS

Tohge, "Direct Preparation of Fine Powders at 80K ..." *Jup. Jul. Appl. Physics* v. 78 (7) Jul. 1989 L. 1175–1178.

*Primary Examiner*—Roy V. King
*Attorney, Agent, or Firm*—Louis J. Bachand

[57] ABSTRACT

Circuit board devices are provided based on use of high temperature superconducting ceramic polymers comprising high temperature superconducting ceramic powders distributed in electrically insulative organic polymers which are thermosetting by reaction of a two-part liquid mixture or by catalytic or photoinitiation of a one-part liquid. The ceramic domains transmit their superconductivity across the insulating barriers of organic polymers enabling formation of superconductive lines and superconducting bonds to electronic devices to be adhered to circuit boards, and providing superconducting circuitry.

13 Claims, 5 Drawing Sheets

METHOD OF MANUFACTURING CERAMIC SUPERCONDUCTOR CIRCUIT BOARD

REFERENCE TO RELATED APPLICATIONS

This is a division of application Ser. No. 08/173,242, filed on Dec. 23, 1993, now U.S. Pat. No. 5,504,138 which is in turn a continuation-in-part of application Ser. No. 08/111,711, filed on Aug. 25, 1993, now U.S. Pat. No. 5,378,737, which in turn is a continuation of application Ser. No. 07/399,699, filed on Aug. 28, 1989, now abandoned, which is in turn a continuation of application Ser. No. 06/739,827, filed May 31, 1985, now abandoned, all with coinventor Don D. Porteous, and is further a continuation-in-part of my application Ser. No. 07/699,743, filed May. 14, 1991, now abandoned. The disclosures of these several applications are hereby incorporated herein by this reference.

FIELD OF THE INVENTION

This invention relates to circuit boards and circuit board devices comprising a support such as a glass-epoxy panel or other substrate, and one or more electronic components, such as integrated circuit components, transistors, quad flat packs, multichip modules, resistor, rectifier, capacitor, or other component having current or magnetic flux carrying, storing or modifying capability, bonded to the support, and one or more conductive lines electrically connected to the components to define a circuit. While the invention will be generally described in connection with circuit boards used for the generation, control and modification of electrical signals, the invention is equally applicable to circuit boards used for shielding against electromagnetic-induced radiation and radio frequency-induced radiation.

SUMMARY OF THE INVENTION

The present invention provides a high temperature superconducting ceramic polymer based on the incorporation of high temperature superconducting ceramic powders into electrically insulative synthetic organic polymers. The polymers are thermosetting e.g. by reaction of a two-part system or by catalytic means, e.g. photoinitiation, of a one-part liquid. These powder-polymer mixtures are superconducting as demonstrated by the Meissner Effect of suspending a magnet above them when energized. This superconductivity is explainable as the effect of the ceramic domains transmitting their superconductivity across the insulating barriers of the organic polymers.

The invention includes the bonding of high temperature superconductor polymer compositions to printed circuit boards to form superconductive conductive lines and other superconductive circuitry, and to bond integrated circuits and discrete components to printed circuit boards as described in the examples following.

The invention further relates to novel adhesive and conductive compositions which are organic, superconductor powder filled, low temperature curing, nonembrittling and flexible in transitions from room temperature to superconducting temperature regimes, and superconducting in the form of conductive lines or bonds in circuit board devices.

In a particular embodiment, the invention provides novel superconducting, adhesive compositions comprising superconductive powders in noncontacting distribution through an insulative organic polymer matrix.

In these and like embodiments of the invention certain ceramic oxide superconductive compositions preferably are used as the powder superconductor. The invention encompasses superconductors having one of two forms of supermolecules. One is the cradle form, and the other is the sandwich form. The invention preferably employs certain thermosetting polymers as the matrix, typically urethane or acrylic polymers having relatively soft segments interspersed with hard segments to lend the polymer matrix flexibility under changes in environment temperature and resistance to debonding under such temperature changes, such that the polymers are excellent adhesive and bonding agents while being conductive and superconductive in circuit board device applications. Preferred polymers are urethane polymers comprising a urethane reaction product of a first side comprising an aromatic isocyanato reagent simultaneously with each reagent of a second side comprising a premix of a hydroxylated tertiary amine and another polyol, the premix reagents being differentially reactive with the isocyanato reagent. These urethane polymers are typically prepared by mixing a first side comprising an isocyanato reagent under polymer forming conditions simultaneously with a second side comprising a premix of an hydroxylated tertiary amine and a polyol reagent, and reacting to form a polymeric urethane composition. The superconductive compositions are mixed with the mixed, unreacted polymer sides and the mass cured.

The present invention provides advantages in the construction of circuit board devices. Importantly, cure of the organic polymer matrix with the superconductor particle powder in situ is effected at low temperatures. Thus the devices are not exposed to extremes of temperature, very high for forming the superconductor, e.g. 950° C., and low for achieving superconducting critical temperatures. In the present invention, the high temperature processing of the superconductor is effected before mixing with the organic polymer.

Surprisingly, it has been ascertained that the superconducting condition in the organic polymer matrix for the superconductor powder does not require contiguous disposition or physical contact between the particles of the powder. Superconductor filler loadings of as little as 40%, or lower to 10% in certain cases, and up to 75% in electrically insulative synthetic organic polymer as herein described are effective superconductor structures.

At the same time, these mixtures are true bonding agents. This opens the manufacture of circuit boards and circuit board devices to highly simplified processes, commonly requiring only deposit of the filled polymer in the desired pattern by any of various means including pantographic deposition along X,Y axes, silk-screen, other kinds of printing including spray, electrostatic, laser, and the like.

Previous practices such as preparation of precision laminates of copper, silver or gold, photographic definition of patterns, etching, washing, re-etching, re-washing and so on are time consuming, expensive, environmentally hazardous, and at that do not provide superconductivity in conductive lines on circuit boards, or in the bonds between the board electronic components and the conductive lines.

The present invention provides superconductivity, bond strength, and precision manufacture without the complicated processes of the past.

The speed at which computers and other electronics operate is limited by the ability of transistors, integrated circuits and other devices to respond to signals. An increase in speed in the normal conducting processes will enhance the rate at which computers calculate and other digital or analog electronics devices operate. Integrated circuits presently available and future integrated circuits manufactured using superconducting circuitry, are advantageously connected by superconducting circuitry on the printed circuit boards, to take advantage of superconducting processes within the integrated circuits and between integrated circuits on larger printed circuit boards. The term printed circuit board is used herein to refer to the known flat panel of fiber reinforced resin and as well to other structures which provide support to integrated circuits and other electronic devices whether planar, three dimensional, linear or other regular or irregular form, in a predetermined but not necessarily fixed arrangement.

Modification of existing techniques for the design and manufacture of printed circuit boards to use superconductors is limited by the inability of the different materials which must be used to tolerate the different thermal expansion characteristics of other materials in taking the board to temperature regimes necessary for superconductivity. In particular/the popular ceramic superconductors are brittle and if fixed to a board resist the differential forces of contraction occasioned by the temperature changes in proceeding to the superconducting regime. Fractures will inevitably occur within the brittle superconducting ceramic circuitry.

It has been discovered that incorporation of the ceramic superconductors, and other superconducting materials as well, in a polymeric matrix will enable the manufacture of printed circuit boards using ceramic superconductors as conductive paths between electronic devices and for conductive bonding of the devices to the circuit board support.

It has further been discovered that the polymeric matrix is advantageously an electrically insulative synthetic organic polymer, that the ceramic and other superconductors may be added as particles of a fine powder (e.g. 25 to 100 microns) to the polymer matrix, that the concentration of particles need not be, and preferably is not such that the component particles are contiguous with one another or in physical contact, the superconductivity being achieved by interparticle transfer of electron energy across the intervening space which is filled with the polymer.

It has still further been discovered that the matrix polymer is advantageously nonembrittling and flexible at superconducting temperature regimes, as by having within the polymer segments which are relatively soft as well as segments which are relatively hard, segments which are flexible and segments which are not. Such polymers enable the differential movement of the board, the electronic components, and the polymer matrix for although in a typical installation, the polymer matrix is bonded to the board and or component, the bonding affects the polymer matrix in one or two directions, other directions are left free and the contraction/.expansion forces are accommodated without fracture. The brittle ceramic superconductor is not bonded as a rigid structure but rather as a distributed mass of particles which move with the polymer matrix and maintain their superconductivity as well. The phenomenon of superconductivity in the invention structures is independent of contiguousness between adjacent superconductor particles and thus their immediate relative disposition is not critical. In this connection it is well to remember that the use of anisotropic or substantially anisotropic and thus nondirectional superconductors is preferred for optimum results.

In particular aspects the invention provides a circuit board device comprising a support, electronic components arranged in predetermined circuit relation on the support in operative association with a superconductive medium comprising an electrically insulative synthetic organic thermosetting polymer matrix having finely divided superconductor particles distributively filled therein in adjacent and noncontiguous relation and in an amount rendering the medium superconductive under temperature conditions below the critical temperature of the superconductor particles, the particles comprising superconductors of the formula of Periodic Table Group I metal-intercalated buckminster fullerenes or thusly intercalated graphite, ceramic superconductors of these forms and formulas:

| Cradle Form: | | |
|---|---|---|
| Y | $Sr_2$ | $Cu_3$ |
| Y | $Ba_2$ | $Cu_3$ |
| La | $Sr_2$ | $Cu_3$ |
| La | $Ba_2$ | $Cu_3$ |
| Ga | $Sr_2$ | $Cu_3$ |
| Ga | $Ba_2$ | $Cu_3$ |
| In | $Sr_2$ | $Cu_3$ |
| In | $Ba_2$ | $Cu_3$ |
| Tl | $Sr_2$ | $Cu_3$ |
| Tl | $Ba_2$ | $Cu_3$ |
| Sb | $Sr_2$ | $Cu_3$ |
| Sb | $Ba_2$ | $Cu_3$ |
| Bi | $Sr_2$ | $Cu_3$ |
| Bi | $Ba_2$ | $Cu_3$ |

| Sandwich Form: | | | |
|---|---|---|---|
| $Y_2$ | $Sr_4$ | xxx | $Cu_3$ |
| $Y_2$ | $Ba_4$ | xxx | $Cu_3$ |
| $Y_2$ | $Sr_2$ | $Ca_2$ | $Cu_3$ |
| $Y_2$ | $Ba_2$ | $Ca_2$ | $Cu_3$ |
| $Y_2$ | $Sr_2$ | $Ba_2$ | $Cu_3$ |
| $La_2$ | $Sr_4$ | xxx | $Cu_3$ |
| $La_2$ | $Ba_4$ | xxx | $Cu_3$ |
| $La_2$ | $Sr_2$ | $Ca_2$ | $Cu_3$ |
| $La_2$ | $Ba_2$ | $Ca_2$ | $Cu_3$ |
| $La_2$ | $Sr_2$ | $Ba_2$ | $Cu_3$ |
| $Tl_2$ | $Sr_4$ | xxx | $Cu_3$ |
| $Tl_2$ | $Ba_4$ | xxx | $Cu_3$ |
| $Tl_2$ | $Sr_2$ | $Ca_2$ | $Cu_3$ |
| $Tl_2$ | $Ba_2$ | $Ca_2$ | $Cu_3$ |
| $Tl_2$ | $Sr_2$ | $Ba_2$ | $Cu_3$ |
| $Bi_2$ | $Sr_4$ | | $Cu_3$ |
| $Bi_2$ | $Ba_4$ | | $Cu_3$ |
| $Bi_2$ | $Sr_2$ | $Ca_2$ | $Cu_3$ |
| $Bi_2$ | $Ba_2$ | $Ca_2$ | $Cu_3$ |
| $Bi_2$ | $Sr_2$ | $Ba_2$ | $Cu_3$ |

Equimolar Cradle and Sandwich Form:
(Tri-layered laminate 1-1-1-2 Form)

| Y | Sr | Sr | $Cu_2$ |
|---|---|---|---|
| Y | Sr | Ca | $Cu_2$ |
| Y | Ba | Ba | $Cu_2$ |
| Y | Ba | Ca | $Cu_2$ |
| Y | Ba | Sr | $Cu_2$ |
| Tl | Sr | Sr | $Cu_2$ |
| Tl | Sr | Ca | $Cu_2$ |
| Tl | Ba | Ba | $Cu_2$ |
| Tl | Ba | Ca | $Cu_2$ |
| Tl | Ba | Sr | $Cu_2$ |
| Bi | Sr | Sr | $Cu_2$ |
| Bi | Sr | Ca | $Cu_2$ |
| Bi | Ba | Ba | $Cu_2$ |
| Bi | Ba | Ca | $Cu_2$ |
| Bi | Ba | Sr | $Cu_2$ |

Try-layer (2-1-1-2) Sandwich Form

| $Y_2$ | Sr | Sr | $Cu_2$ |
|---|---|---|---|
| $Y_2$ | Sr | Ca | $Cu_2$ |
| $Y_2$ | Sr | Ba | $Cu_2$ |
| $Y_2$ | Ba | Ba | $Cu_2$ |
| $Y_2$ | Ba | Ca | $Cu_2$ |
| $Bi_2$ | Sr | Sr | $Cu_2$ |
| $Bi_2$ | Sr | Ca | $Cu_2$ |
| $Bi_2$ | Sr | Ba | $Cu_2$ |
| $Bi_2$ | Ba | Ba | $Cu_2$ |
| $Bi_2$ | Ba | Ca | $Cu_2$ |

-continued

| Tri-layer (2-2-1-2) Sandwich Form: (with D-Metal Bridges) | | | |
|---|---|---|---|
| $Y_2$ | $Sr_2$ | Sr | $Cu_2$ |
| $Y_2$ | $Sr_2$ | Ca | $Cu_2$ |
| $Y_2$ | $Sr_2$ | Ba | $Cu_2$ |
| $Y_2$ | $Ba_2$ | Ba | $Cu_2$ |
| $Y_2$ | $Ba_2$ | Ca | $Cu_2$ |
| $Bi_2$ | $Sr_2$ | Sr | $Cu_2$ |
| $Bi_2$ | $Sr_2$ | Ca | $Cu_2$ |
| $Bi_2$ | $Sr_2$ | Ba | $Cu_2$ |
| $Bi_2$ | $Ba_2$ | Ba | $Cu_2$ |
| $Bi_2$ | $Ba_2$ | Ca | $Cu_2$ |
| $Tl_2$ | $Sr_2$ | Sr | $Cu_2$ |
| $Tl_2$ | $Sr_2$ | Ca | $Cu_2$ |
| $Tl_2$ | $Sr_2$ | Ba | $Cu_2$ |
| $Tl_2$ | $Ba_2$ | Ba | $Cu_2$ |
| $Tl_2$ | $Ba_2$ | Ca | $Cu_2$, | or halogen-intercalated derivatives thereof.

Typically, in this embodiment of the invention: the electronic components are selected from one or more of integrated circuits, resistors, rectifiers, capacitors, and current, capacitance, resistance, and magnetic flux carrying, storing or modifying components,. the components being electrically connected to the medium; the medium defines conductive paths between the electronic components; the medium is deposited on the support to define the conductive paths; the medium is self-adherent to the components; the medium bonds the components to the support; the medium defines conductive paths electrically interconnecting the components, the components being connected to the conductive paths through the medium bonded between the components and the paths; the superconductive medium provides electrical interconnection between the components is interposed between the components and the support in conductive bonding relation; the support defines a plurality of conductive lines, the components being mounted on the support by the medium, the medium electrically connecting the components to conductive lines; and, the support is a rigid structure.

The term "operative association of the medium and the components" as used herein includes bonding of the medium to the components and/or providing an electrically conductive relation therebetween. In preferred modes, the electrically insulative synthetic organic polymer medium is differentially flexible along its extent against debonding in response to expansion and contraction forces experienced during temperature transitions to and from the superconducting critical temperature for the superconductor particles. The medium synthetic organic polymer then typically comprises relatively hard and soft segments providing differential flexibility along the extent of the medium.

In other aspects of the invention, there is provided a circuit board device in which the medium synthetic organic polymer comprises one or more of urethane, epoxy, silicone, acrylic, unsaturated polyester, polyimide, phenolic, and bismaleimide thermosetting polymers having relatively soft segments and relatively hard segments. e.g. the medium synthetic organic polymer comprises a urethane polymer reaction product of a first side comprising a polyol and an isocyanate and a second side comprising an amine and polyether polyol, more particularly the organic polymer comprises a urethane reaction product of a first side first polyol and an aromatic isocyanate and a second side hydroxylated tertiary amine and a second polyol differentially reactive with the first side to form relatively soft and hard segemnts. Alternatively, the organic polymer is catalyst or photo-initiated e.g. a light curable acrylic polymer.

In other embodiments: a circuit board device is provided in which the superconductor particles are present in superconducting amounts between 10 and 75% by weight of the polymer and particles together, the particles being substantially noncontiguous so as to form discontinuous and not continuous physical path of particles through the medium; the superconductor particles are present in an amount above about 90% by weight of the polymer and the particles taken together, the particles being substantially contiguous; the superconductor particles are substantially anisotropic; the superconductor particles comprise yttrium barium copper oxide; or the superconductor particles comprise thallium barium calcium copper oxide.

In another embodiment there is provided a method of manufacturing a circuit board for a circuit board device comprising a support and an electronic component, including mixing a powder comprising superconductor particles with the reactive precursors to a thermosetting polymer, applying the mixture to the support in a predetermined pattern for operative association with the electronic component, and curing the mixture in bonding relation with the support.

In this method typically, there is further included selecting as the reactive precursors precursors providing a thermoset polymer having relatively soft and relatively hard segments for flexibility against debonding in response to expansion and contraction forces experienced during temperature transitions to and from superconducting critical temperature for the superconductor particles; applying the mixture from a static mixer fed from separate supplies of the reagent precursors, at least one of which contains the powder; combining the precursors previously cooled to be nonreactive and warming to form the mixture; applying and curing the mixture at temperatures in the range of 15° to 30° C.; formulating the mixture to have a viscosity to be sprayed onto the support, and spraying the mixture onto the support; formulating the mixture to have a viscosity to be silk-screened, and silk-screening the mixture onto the support; interposing the mixture between the support and the component, and bonding the component to the support with the mixture in superconductive relation; defining conductive lines with the predetermined pattern of the mixture on the support for connection with the component; interposing the mixture between a conductive line on the support and the component to bond the component to the support and connect the component and the conductive line in superconductive relation; selectively curing portions of the applied mixture and removing uncured portions thereof to define the predetermined pattern; selecting a light curing thermosetting polymer for the mixture, applying the mixture under controlled conditions not effecting cure of the polymer, selectively curing the polymer by controlled application of light, and removing uncured portions thereof to define the predetermined pattern; and applying multiple passes of the mixture atop one another according to the predetermined pattern to define thick-film circuitry.

In another embodiment, the invention provides a circuit board comprising a circuit support, an electronic device on the support, and a superconductive line connected to the device and bonded to the substrate, the superconductive line comprising superconductor particles distributively disposed within a matrix comprising an electrically insulating, thermosetting organic polymer bonded to the substrate, the superconductive line being subject to thermal expansion and contraction forces during transition between room temperature and superconducting temperatures for the superconductive particles normally causing the debonding of the superconductive line from the substrate, the organic polymer matrix having differentially flexible portions along the extent of the superconductive line sufficient to limit embrittlement of the polymer and resultant debonding for debonding-free response of the polymer matrix to the expansion and contraction forces, whereby the circuit board has a superconductive line which does not debond from the substrate during the transition.

In another embodiment, the invention provides a superconducting bonding agent for connection of circuit board substrates to electronic components, the bonding agent comprising an electrically insulating, thermosetting organic polymer matrix having superconductive particles distributively disposed therein in concentrations providing superconductivity through the bonding agent under conditions rendering the particles superconductive.

In this and like embodiments, typically, the superconducting particles comprise from 40 to 90% by weight of the total weight of the organic polymer and the particles; the superconducting particles are substantially noncontiguous within the organic polymer matrix; the organic polymer comprises urethane, epoxy, silicone, acrylic, unsaturated polyester, polyimide, phenolic, or bis-maleimide polymer and combinations thereof; and, the polymer has differentially flexible portions to accommodate thermal expansion and contraction forces during transitions from room temperature to temperatures at which the superconducting particles are superconducting.

In sum, in the present invention there is taught the incorporation of superconductors into flexibilized polymers, polymers having sufficient soft segments to provide forgiveness to differential forces of contraction between the superconductors and the support or substrates. Such polymers further are advantageously possessed of a low cure temperature. The lower the cure temperature of the thermosetting polymer, the lower the differential expansion, a result of the cure temperature being closer to the cryogenic temperatures at which the circuitry operates.

For example, while theoretically it is possible to sinter a superconductor onto a substrate at 1230° K. (the sintering temperature for the ceramic yttrium barium copper oxide superconductor, i.e. YBCO), the circuitry will need to operate at temperature closer to 100° K., a tremendous temperature range, the transitioning of which is likely to shatter brittle sintered ceramic superconductors. According to this invention, it is possible to build circuitry closer to room temperature (300° K.). This improvement alone reduces the differential forces of contraction by 75%. As discussed below, selected urethane polymers can be used having considerable soft-segments and which cure at close to room temperature as the polymer matrix to realize this improvement.

Manufacturing advantages as well accrue from use of the present invention. Circuitry can be directly manufactured by laying down the conductive lines and bonding stations to receive the electronic components by direct processes involving application of a flowable mixture of superconductor particle powder and the polymer matrix described herein. For example, a dual dispensing device, comprising a pair of side-by-side chambers each containing one side of the thermosetting resin, e.g. a urethane, and a static head mixer can be directed at the site of application and the mixture applied in the desired pattern. through a fine needle onto a printed circuit board. The circuitry traces can be gang-applied using a plurality of multiple pantographic static-head mixer dispensers mounted on a stage having an x-y driver, the circuit boards being referenced to the stage and dispensing needles. Accurate circuitry lines are achieved, and these can subsequently cure at room temperature. The use of room-temperature processing urethanes alone provides a substantial manufacturing advantage over elevated temperature curing processes, e.g. of epoxies which may require 400° K. to 500° K. temperatures to cure.

This direct method of applying circuitry obviates the present complicated, cumbersome, expensive and error prone multistep process involving applying a solder mask over copper-clad board, application of photoresist, washing away the mask and resist, etching copper with harsh chemicals, and washing away the etchant.

BRIEF DESCRIPTION OF THE DRAWINGS

The invention will be further described as to an illustrative embodiment in conjunction with the attached drawings in which.

DETAILED DESCRIPTION OF THE INVENTION

Figure 5:
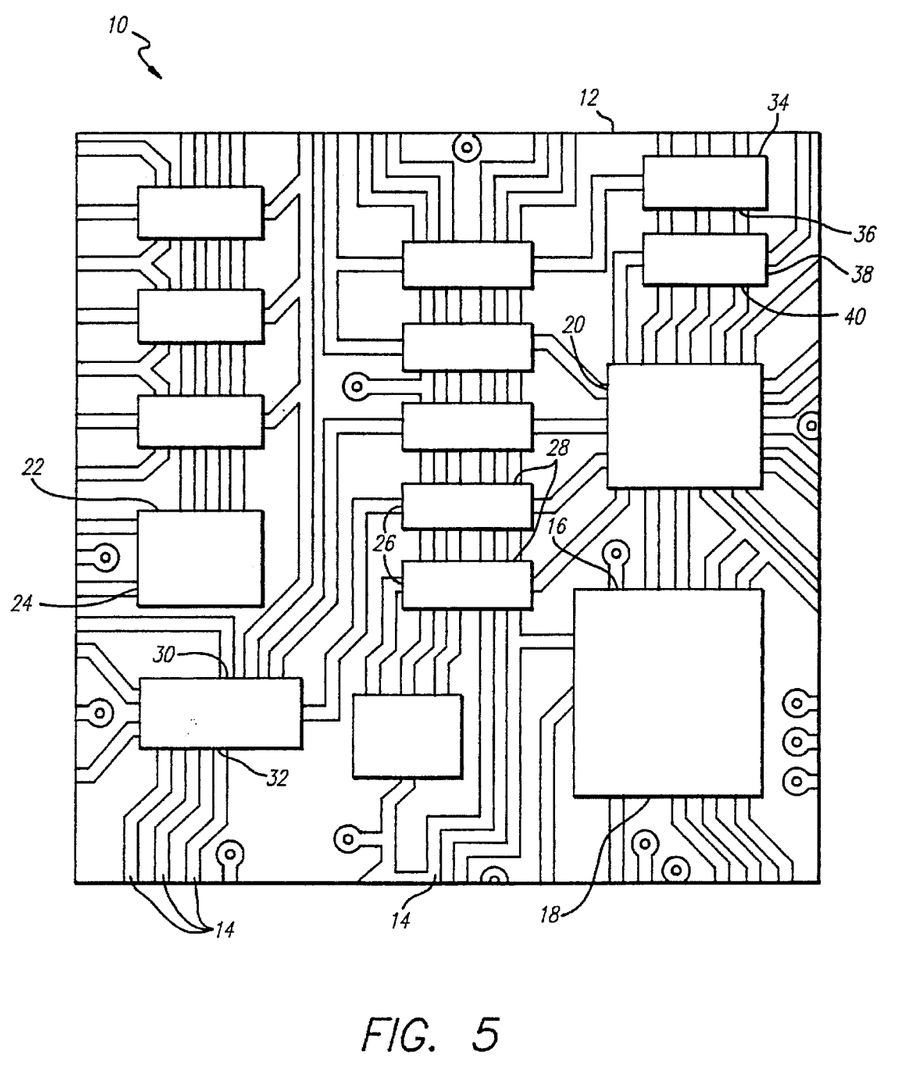
FIG. 5 is a plan view of a circuit board device according to the invention.

With reference to the drawings, the cradle, sandwich, stacked and nested forms of ceramic superconductors depicted in FIGS. 1–4 are described below. The circuit board device shown at 10 in FIG. 5 comprises a board support 12 having conductive lines 14 defining circuitry and connecting the discrete electronic components shown, including a quad flat pack 16 having leads bonded at 18 to the conductive lines by the polymer/ceramic superconductor compositions of the invention. The conductive lines 14 are also of the same composition and thus are superconductive. FIG. 5 further shows multichip module 20 having a pin grid array bonded by the invention composition to the conductive lines 14 through a hole fixturing configuration. Multichip module 22 is bonded at 24 to the conductive lines 14 by the invention composition using a ball grid array. Dual in-line packages 26 are bonded at 28 to conductive lines 14 by the invention composition in a surface mount configuration. Resistor 30 is bonded at 32 to conductive lines 14 by the invention compositions in a through hole configuration. Rectifier 34 is bonded at 36 to conductive lines 14 by the invention compositions in a through hole configuration. Capacitor 38 is bonded at 40 to the conductive lines 14 in a through hole fixturing configuration. The conductive lines 14 are applied by silk-screening, spray, painting and like methods. Electronic components are bonded by application of the invention composition e.g. with a dual cartridge dispenser in appropriate locations, followed by mounting the device on the bond composition. e.g. by its projecting leads.

EXAMPLES

The invention is illustrated in the following Examples.

Example 1

A thermosetting side A component-side B component urethane polymer was prepared. A high temperature superconductor powder was prepared and incorporated into the formula. The polymer side A component was prepared as follows:

| | |
|---|---|
| Diphenylmethane diisocyanate (Mondur CD) | 371 grams |
| Castor oil (Caschem) | 100 grams |
| Carbon black dispersion (Black 4848, Ferro) | 2.3 grams |

These materials were mixed in a quartz vessel, heated to 65° C. and degassed at a pressure of 5 millimeters of mercury. After cooling to room temperature, 180 ccs of this quasi-prepolymer was packaged into one side of a dual cartridge having side-by-side chambers.

| | |
|---|---|
| 6000 MW polyether polyol triol (Multranol 3901) | 172 grams |
| 150 MW polyether polyol triol (Multranol 4012) | 217 grams |
| Ethylenediamine tetrapropoxylate (Quadrol) | 34 grams |
| m-Xylene diamine | 8 grams |
| Bismuth naphthenate (Coscat 83) | 0.2 grams |

These ingredients were weighed and mixed in a one quart container and heated to 110 C. The pressure was reduced to 5 millimeters of mercury to facilitate dewatering and degassing. This component was cooled to room temperature and 180 ccs. were packaged into the other side of the dual cartridge.

A static mixer tip was attached to the dual cartridge and the cartridge was placed in a manual dispenser. By squeezing the trigger on the manual dispenser, 10 grams of a fully-mixed urethane paste were dispensed into a cup. Using a heat gun, this mass was cured to form a hard mass. A 50 Shore D urethane was formed after cool-down to room temperature.

A YBCO superconductor was prepared as follows:

Yttrium Oxide, 136 grams, and Barium Carbonate, 483 grams, and 351 grams of Copper Oxide were mixed. A portion of this mixture was heated at 5 degrees °C. per minute to 950 degrees °C. The mixture was sintered at 950 degrees °C. for 24 hours. Then oxygen was introduced to the mixture and the mixture was cooled at 2 degrees °C. per minute to 600 degrees °C. The mixture was left at 600 degrees °C. for 4 hours and then cooled at 2 degrees °C. per minute to 400° C. The ceramic was removed from the furnace, ground to a fine powder and then maintained in a dry condition until incorporated as a fine powder into the polymer.

The prepared superconductor YBCO powder was weighed to 6.2 grams and placed in a 6 ounce cup. Exactly two grams of urethane ComponentA/ComponentB mixture were expressed into the cup. The YBCO powder and urethane were mixed until homogeneous. The mixture was then placed into a mold having dimensions of approximately 1.2 inches diameter by 0.1 inches thick. Using a heat gun, the polymer matrix was cured in the mold. The resultant high temperature superconductor matrix/ceramic superconducting particles product as a molded polymer disk was removed from the mold, cooled under liquid nitrogen. The superconducting nature of the product was confirmed by observing the Meissner EffecT: A cerium magnet of approximately 0.1 inches thick by 0.1 inches in diameter was placed over the disk and did not fall to the disk, a diamagnetic response indicative of superconductivity.

Example 2

In a darkened room, the following acrylic materials were weighed into a eight ounce cup:

| | |
|---|---|
| Bisphenol-A diglycidyl dimethacrylate | 60 grams |
| Triethene glycol dimethacrylate | 40 grams |
| Diethylamino ethyl methacrylate | 2.5 grams |
| Camphoroquinone | 0.25 grams |

These materials were mixed in the dark and were placed in a non-light-transmitting plastic container.

Two grams of the acrylic mixture were admixed with 6.2 grams of the prepared YBCO powder from Example 1. A thin layer of this mixture was placed on a paper pad and exposed to a black lamp of 280 to 350 nanometers for 60 seconds. A partial cure was obtained, but the polymer had substantially uncured portions. This same mixture was placed between layers of polyethylene in a 5 to 10 mil thickness. A more thorough cure was obtained after 30 minutes exposure with the black lamp. This layer exhibits the Meissner Effect.

Example 3

A thermosetting Component A/Component B urethane formula was prepared. A commercially available superconductor powder was incorporated into the formula. The Component A was prepared as follows:

| | |
|---|---|
| Diphenylmethane diisocyanate | 172 grams |
| Cstor oil | 46 grams |
| Carbon black dispersion | 4.4 grams |

These materials were mixed in a quartz vessel, heated to 65° C. and degassed at a pressure of 5 millimeters of mercury. After cooling to room temperature, 180 ccs of this quasi-prepolymer was packaged into one side of a dual cartridge having side-by-side chambers.

The Component B was prepared in exactly the same manner as Component B of Example 1 and placed side-by-side with the above Component A.

A static mixer tip was attached to the dual cartridge and the cartridge was placed in a manual dispenser. By squeezing the trigger on the manual dispenser, 10 grams of a fully-mixed urethane paste were dispensed into a cup. Using a heat gun, this mass was cured to form a hard mass. A 50 Shore D urethane was formed after cool-down to room temperature.

YBCO powder of 2 micron nominal size (Ct. No. 35,746-4) was obtained from Aldrich Chemical Company and processed in exactly the same manner as the YBCO mixture of Example 1. It was ground using a mortar and pestle into a fine powder and stored in a desiccator. YBCO powder was weighed to 6.2 grams in a cup.

The Example 3 superconductor YBCO powder was weighed to 6.2 grams and placed in a 6 ounce cup. Exactly two grams of urethane Component A/Component B of Example 3 mixture were expressed into the cup. The YBCO powder and urethane were mixed until homogeneous. The mixture was then placed into a mold having dimension of approximately 1.2 inches diameter by 0.1 inches thick. The polymer matrix was cured in the mold by placing in an oven at 100° C. for 15 minutes. The molded polymer disk was removed from the mold, cooled under liquid nitrogen, and a cerium magnet of approximately 0.1 inches thick by 0.1 inches in diameter was placed over the disk and exhibited the Meissner Effect.

Example 4

The Example 3 superconductor YBCO powder was weighed to 6.2 grams and placed in a 6 ounce cup. Exactly three grams of urethane Component A/Component B of Example 3 mixture were expressed into the cup. The YBCO powder and urethane were mixed until homogeneous. The mixture as then placed into a mold having dimension of approximately 1.2 inches diameter by 0.1 inches thick. The polymer matrix was placed in an oven for 15 minutes at 100° C. and cured in the mold. The molded polymer disk was removed from the mold, cooled under liquid nitrogen, and a cerium magnet of approximately 0.1 inches thick by 0.1 inches in diameter was suspended over the disk; The Meissner Effect was exhibited.

Example 5

The Example 3 superconductor YBCO powder was weighed to 6.2 grams and placed in a 6 ounce cup. Exactly four grams of urethane Component A/Component B of Example 3 mixture were expressed into the cup. The YBCO powder and urethane were mixed until homogeneous. The mixture was then placed into a mold having dimensions of approximately 1.2 inches diameter by 0.1 inches thick. The polymer matrix was placed in an oven for 15 minutes at 100° C. and cured in the mold. The molded polymer disk was removed from the mold, cooled under liquid nitrogen, and a cerium magnet of approximately 0.1 inches thick by 0.1 inches in diameter was suspended over the disk, exhibiting the Meissner Effect.

Example 6

The Example 3 superconductor YBCO powder was weighed to 1.5 grams and placed in a 6 ounce cup. Exactly 1.45 grams of urethane Component A/Component B of Example 3 mixture were expressed into the cup. The YBCO powder and urethane were mixed until homogenous. The mixture was then placed into a mold having dimensions of approximately 1.2 inches diameter by 0.1 inches thick. The polymer matrix was placed in an oven for 15 minutes at 100° C. and cured in the mold. The molded polymer disk was removed from the mold, cooled under liquid nitrogen, and a cerium magnet of approximately 0.1 inches thick by 0.1 inches in diameter was suspended over the polymer disk, exhibiting the Meissner Effect.

Example 7

To exactly 2 grams of Component A of Example 3 were admixed 6.2 grams of the YBCO superconducting powder of Example 3. Exactly 0.02 grams of fumed silica M5 were admixed creating a liquid mixture of sufficient thickness so the high YBCO powder did not settle from the mixture. Approximately 3 ccs. of thixotropic mixture were placed in one chamber of side-by-side chambers of a dual chamber cartridge. The air was expelled from the chamber as the piston was inserted.

To exactly 2 grams of Component B of Example 3 were admixed 6.2 grams of YBCO superconducting powder of Example 3. Exactly 0.02 grams of fumed silica were admixed to the mixture to form a paste which suspended the YBCO powder. This mixture was added to the other chamber of the dual cartridge. The air was expelled as the piston was inserted.

A static mixer tip was attached to the dual chamber cartridge. A plunger was attached to facilitate manual dispensing. Upon the push of the plunger with the thumb, a mixture was dispensed into the same disk mold as in previous examples and also dispensed as a conductive line on a printed circuit board (PCB) approximately 3 inches long by 5 mils in diameter. Both the disk and PCB board sample were placed in an oven at 100° C. for 15 minutes. The molded polymer disk was removed from the mold, cooled under liquid nitrogen, and a cerium magnet of approximately 0.1 inches thick by 0.1 inches in diameter was suspended over the polymer disk, exhibiting the Meissner Effect. The PCB was also placed under liquid nitrogen. The polymer line remained intact, fully-bonded to the PCB and did not exhibit cracking despite the extreme temperature change.

Example 8

To exactly 3 grams of Component A of Example 3 were admixed 6.2 grams of the YBCO superconducting powder of Example 3. Exactly 0.02 grams of fumed silica M5 were admixed creating a liquid mixture of sufficient thickness so the high YBCO powder did not settle from the mixture. Approximately 3 ccs. of thixotropic mixture were placed in one chamber of side-by-side chambers of a dual chamber cartridge. The air was expelled from the chamber as the piston was inserted.

To exactly 3 grams of Component B of Example 3 were admixed 6.2 grams of YBCO superconducting powder of Example 3. Exactly 0.02 grams of fumed silica were admixed to the mixture to form a paste which suspended the YBCO powder. This mixture was added to the other chamber of the dual cartridge. The air was expelled as the piston was inserted.

A static mixer tip was attached to the dual chamber cartridge. A plunger was attached to facilitate manual dispensing. Upon the push of the plunder with the thumb, a mixture was dispensed into the previously used disk mold. The disk mold was placed in an oven at 100° C. for 15 minutes. The molded polymer disk was removed from the mold, cooled under liquid nitrogen, and a cerium magnet of approximately 0.1 inches thick by 0.1 inches in diameter was suspended over the disk, exhibiting the Meissner Effect.

Example 9

Thallium Barium Calcium Copper Oxide (2-2-1-2) powder (Cat. No. (I10B12, 99.9%) was obtained from Johnson Matthey Catalog Company. It was placed in a furnace for 36 hours with moderate air flow during the sintering process. It was removed from the furnace, cooled to approximately room temperature, ground in a mortar and pestle to create a fine powder. To 6.2 grams of the powder were weighed and admixed in a cup exactly 2 grams of the urethane mixture of Example 3. The admixture was placed in the disk mold and then cured in the oven at 100° C. for 15 minutes. A hard polymer disk was removed from the mold and placed in liquid nitrogen. A cerium magnet was suspended over the mass, exhibiting the Meissner Effect.

The following polymers are typical of those useful in forming the high temperature superconductor polymers of the invention:

A. Urethanes:
1. Isocyanato reagents:
   a. Aromatic isocyanates (diphenylmethane diisocyanate, toluene diisocyanate)
   b. Aliphatic isocyanates (methylene dicyclohexane diisocyanate, isophorone diisocyanate)
2. Polyols or amine base reagents:
   a. soft-segment formers: 2000 to 6000 MW polyetheroxide polyol oligomers
      1. having functionalities of 1,2,3
         a) higher functionalities are allowed based on sucrose, etc.
         b) having primary or secondary hydroxyls
   b. Less flexible soft-segment formers:
      1. Castor oil or other di- or multi-functional natural oils with hydroxyl functionality.
      2. 60 MW to 2000 MW polyether polyol oligomers including butanediol, hexane diol and dipropylene glycol.
   c. poly-tetramenthylene oxide ether polyols
   d. polyester polyols (e.g., of dipropylene glycol and adipic acid)
   e. quadrol or amines class (of U.S. Pat. 4,869,400)
   f. aromatic amines (diphenyl methane diamine)
   g. aliphatic amines (M-xylene diamine)
   h. liquid crystal oligomers (such as homopolyesters of aliphatic glycols and biphenyldicarboxylic acid)
3. Including polyurethane foams
B. Epoxies:
1. Types of Epoxides:
   a. Bisphenol A epoxies (condensation reaction of epichlorohydrin and bisphenol A)
   b. Bisphenol F epoxies
   c. Gylcidyl ethers of other aromatic compounds
   d. Novolak epoxies
   e. Glycidyl ethers of aliphatic polyols such as butyl glycidyl ether
   f. Epoxidized oils from the oxidation of unsaturated vegetable oils
   g. Resins from butadiene such as vinylcyclohexane dioxide
2. Primary and secondary amine hardeners:
   a. Ethylene diamine, diethylene triamine, higher analogs
   b. Ethyleneamine-terminated polyols
   c. Aromatic amines such as M-Phenylenediamine and methylene dianiline
   d. Amides
   e. Latent cure epoxies from imidazoles
3. Acid anhydrides:
   a. Reaction product of epoxies and anhydrides such as phthalic and maleic anhydrides
C. Unsaturated polyesters:
1. Alkyds of orthophthalic acids and anhydrides, isophthalic acids and anhydrides terephthalic acids and anhydrides, maleic acids and anhydrides, fumaric acid, halogenated phthalic acids and anhydrides, nadic anhydride, adipic acid, succinic acid, and glycols.
   a. Glycols include ethylene glycol, diethylene glycol, triethylene glycol, propylene glycol, dipropylene glycol, tripropylene glycol, butane diol, pentane diol, hexane diol, polyether polyols.
D. Acrylics:
1. Acrylates include methyl acrylate, methyl methacrylate, ethyl acrylate, butyl acrylate, butyl methacrylate, acrylates of bisphenol
   A. Polyether polyols, polyethylene glycols.
2. Capable of being cured with hydrogen peroxide, benzoic peroxide, or other organo peroxides
3. Containing excimers capable of being cured with U.V. or visible light.
E. Silicones:
1. Addition reaction types: addition reaction products of vinyl silanes and substituted silanes.
2. Condensation reaction types: silicone polymers from condensation of siloxane and silyl ether oligomers.
3. Including silane coupling agents to mineral fillers
F. Phenolics
1. Condensation reaction products of phenol, substituted phenols, aniline, substituted anilines, melamine, ureas with formaldehyde, acetaldehyde, higher aldehydes, hemiacetals and ketones.
G. Polyimides
1. Reaction products of orthophthalic anhydride, trimellitic anhydride, pyromellitic anhydride, and other anhydrides with amines such as P-Phenylene diamine, M-Phenylene diamine and diphenylmethane diamine.
H. Bis-Maleimide
1. Reaction products of maleic anhydride and P-Phenylenediamine.
I. Combinations of the above
1. IPNs (inter penetrating polymer networks) of the above
2. Admixture of the above
3. Composites of the above
4. Including mineral fillers or thermally or electrically conductive fillers
5. Containing supportive matrices such as fiberglass, carbon fibers, etc.

While not wishing to be bound by any particular theory in support of the above invention, it is believed that all known ceramic superconductors may be divided into groups as set forth below having distinctive forms herein referred to a cradle and sandwich forms. This arrangement of the atoms in these ceramic superconductors is believed to account for the superconductivity of the foregoing polymer/ceramic combinations even where the distributed particles of the ceramics are out of contact, the transmission through the polymer, itself an insulator, being the result of the following described organization of the constituent atoms of the ceramic superconductors.

BCS Theory and other theories as they relates to YBCO or other high temperature superconductors (HTSC) do not teach how to build superconductors. BCS theory describes the superconductive process as involving electron pairs; this is consistent with the structures and processes of the present invention.

Various HTSC structures including Y Ba2 Cu3 O6.5 are virtually universally described in the literature to be perovskite-type structures. These structures are square-planar or rombihedral as determined by least square data fits to X-ray diffraction, or neutron beam diffraction data. It is rather believed to be the case that the HTSC's have lattices which are perovskites at temperatures above their critical temperatures, but the perovskite structures orient to hexagonal structures as they become superconductive.

I have predicted that these structures are lattices based on hexagonally-arranged planes of copper or other paramagnetic metals having other special coordination characteristics. The recently published magnetic spectrum of YBCO shows hexagonal concentrations of flux. These flux patterns bear no resemblance square planar structure of perovskites, but provide strong evidence that hexagonal structures of HTSC's I have postulated are correct.

The present invention relates to a specific family of HTSC powders and their incorporation into thermosetting polymers. This family of HTSC materials is described as being determined by supermolecule precursors. Chemical processes can be described for the development of these supermolecule precursors which are formed by selecting certain binary metal oxide, chalcogen or salt compounds from R, D and M Metal categories in specific stoichiometries, reacting these metal oxides, chalcogens or salts in a sintering process, annealing the metal oxides, chalcogen or salts to form ceramics, and then superoxidizing these ceramic precursors at high temperature to produce high temperature ceramic (HTSC) superconductors. The supermolecule intermediate can be the "cradle" structural or the "sandwich" structural forms, depending upon the stoichiometry selected. These forms are defined by the Table 1 below:

Superconducting ceramic compounds of the cradle and sandwich forms are limited to the following atomic ratios and valences for each type of metal atom and oxide:

| Supermolecule Structural Elements | Cradle Form | | | Sandwich Form | | |
|---|---|---|---|---|---|---|
| | No. of Atoms | Valence | Not Charge | Atoms | Valence | Not Charge |
| M metal atom | 2 | 3+ | 6+ | 4 | 3+ | 12+ |
| D metal atom | 4 | 2+ | 8+ | 8 | 2+ | 16+ |
| R metal atom | 6 | 2+ | 12+ | 6 | 2+ | 12+ |
| Structural oxygen | 13 | 2− | 26− | 20 | 2− | 40− |
| Conductive oxygen | 1 | 0 | 0 | 1 | 0 | 0 |
| Net Charge | | | 0 | | | 0 |

The superconducting compound Y Ba2 Cu 3 O6.5 fits the classification of the cradle form where the M Metal atoms are yttrium, the D Metal atoms are barium and the R Metal atoms are copper. It is more accurately be expressed as supermolecule in a ceramic precursor stage of development with stoichiometry of Y2 Ba4 Cu6 O13. The superconducting compound Bi2 Sr2 Ca2 Cu3 O10 is an example of the sandwich structure with the assignments shown in Table 2:

| M Metal Atoms | 4 Bismuth | 3+ Valence |
|---|---|---|
| D Metal Atoms | 4 Strontium | 2+ Valence |
| | 4 Calcium | 2+ Valence |
| R Metal Atoms | 6 Copper | 2+ Valence |

Both structures of the supermolecule are believed to be initially produced as disoriented molecules in situ. Upon annealing the cradle forms are allowed to align and nest and the sandwich forms can stack.

Several of the superconducting ceramic oxides cited in the literature match the stoichiometry of hybrid forms which are combinations of the cradle and sandwich forms. For example the Bi Sr Ca Cu2Ox superconductor is the Bi6 Sr6 Ca6 Cu12 which has equimolar cradle and sandwich forms as shown in Table 3:

| Supermolecule Structural Elements | Metal Assigned | Valence | Cradle Form No. of Atoms | Sandwich Form No. of Atoms | Total No. of Atoms |
|---|---|---|---|---|---|
| M metal atoms | Bismuth | 3+ | 2 | 4 | 6 |
| D metal atoms | Stronium | 2+ | 2 | 4 | 6 |
| | Calcium | 2+ | 2 | 4 | 6 |
| R metal atoms | Copper | 2+ | 6 | 6 | 12 |

Other HTSCs such as Bi Sr Ca Cu (1-1-1-2), Bi Sr Ca Cu (2-1-1-2), Th Ba Ca cu 92-2-1-2) and Bi Ca Sr Cu (2-2-1-2) are forms where two layers of R Metals are alternately sandwiched between three M and D metal superstructure layers.

The R metal must be divelent metal oxides or metal ligands which have all valence shells filled below the Fermi level and where the Fermi level is a single unpaired electron in its ground state. These restriction limit R Metals to copper (2+), bismuth (2+), tin (2+ when subsequently oxidized to 3+) lead (2+ when subsequently oxidized to 3+), and gallium (2+) and titanium 3+. Metal oxides, chalcogens or salts of this group can function as R Metal precursors.

The M Metals must be trivalent (where double bonding of the metal oxide or ligand O=M—O—M=O is essential), and diamagnetic. This group is limited to gallium, indium, thallium, bismuth, antimony, aluminum, lanthanum, and yttrium.

The D Metals must be divalent, diamagnetic, and somewhat polarizable in order for their bond angles to conform to the cyclic supermolecule structural precursors. The D metals are limited to calcium, strontium, barium, cadmium, mercury, tin and lead.

Figure 1A:
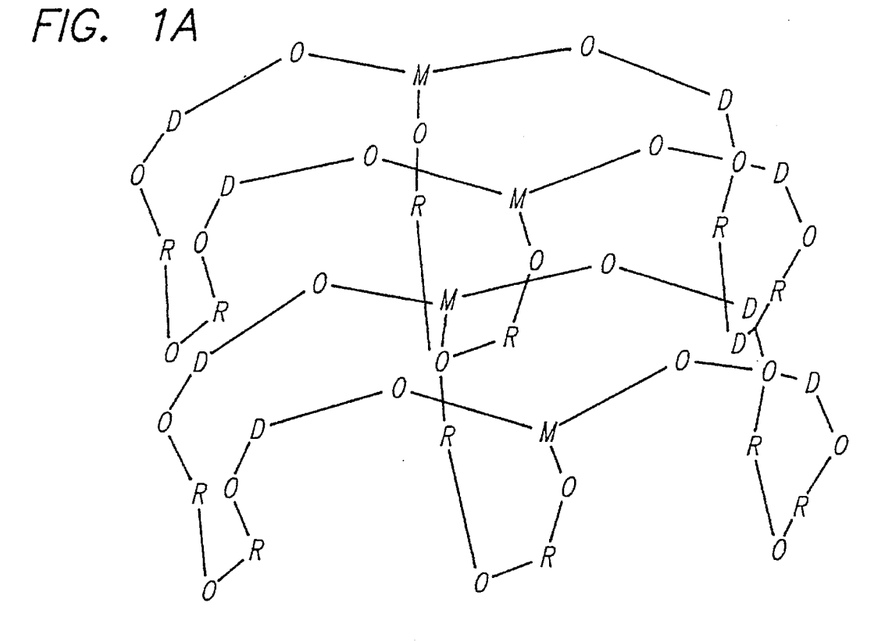
FIG. 1A is a depiction of a cradle form ceramic superconductor.
Figure 1B:
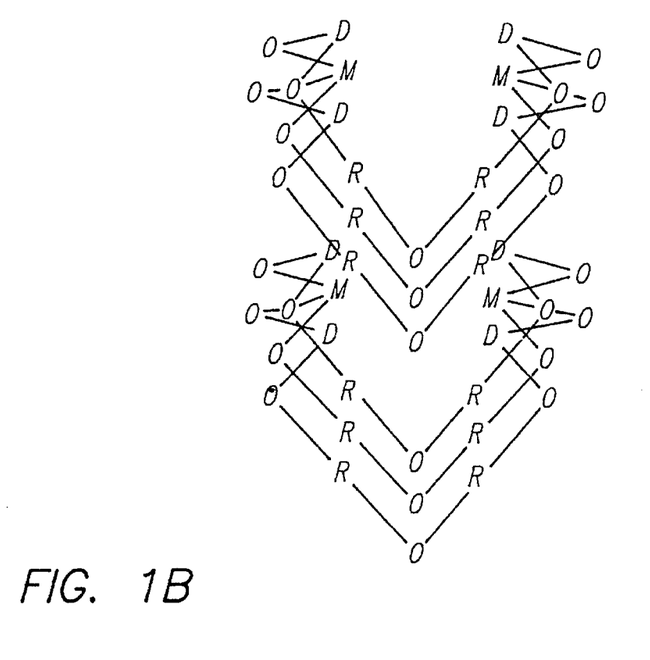
FIG. 1B is a depiction of nested cradle form ceramic superconductor.

By selecting combinations of R, D and M Metal oxide, chalcogen or ligand precursors in various combinations, the following group of superconductor powders can be used in the invention compositions, and have the general forms shown in FIGS. 1–4, respectively:

| Cradle Form: | | |
|---|---|---|
| Y | $Sr_2$ | $Cu_3$ |
| Y | $Ba_2$ | $Cu_3$ |
| La | $Sr_2$ | $Cu_3$ |
| La | $Ba_2$ | $Cu_3$ |
| Ga | $Sr_2$ | $Cu_3$ |
| Ga | $Ba_2$ | $Cu_3$ |
| In | $Sr_2$ | $Cu_3$ |
| In | $Ba_2$ | $Cu_3$ |
| Tl | $Sr_2$ | $Cu_3$ |
| Tl | $Ba_2$ | $Cu_3$ |
| Sb | $Sr_2$ | $Cu_3$ |
| Sb | $Ba_2$ | $Cu_3$ |
| Bi | $Sr_2$ | $Cu_3$ |
| Bi | $Ba_2$ | $Cu_3$ |

Figure 2A:
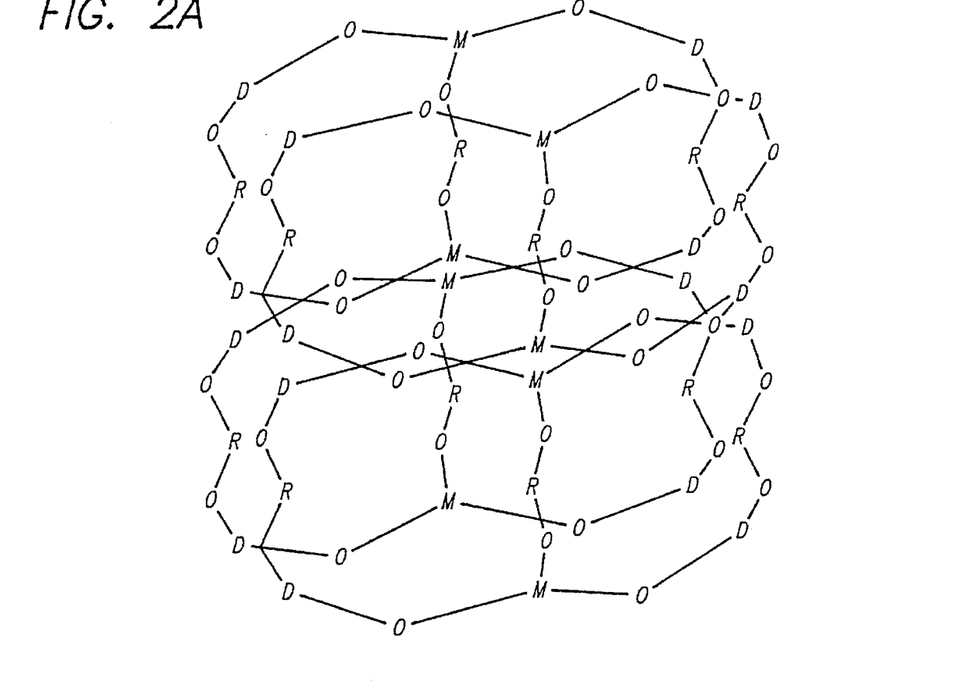
FIG. 2A is a depiction of a sandwich form of ceramic superconductor.
Figure 2B:
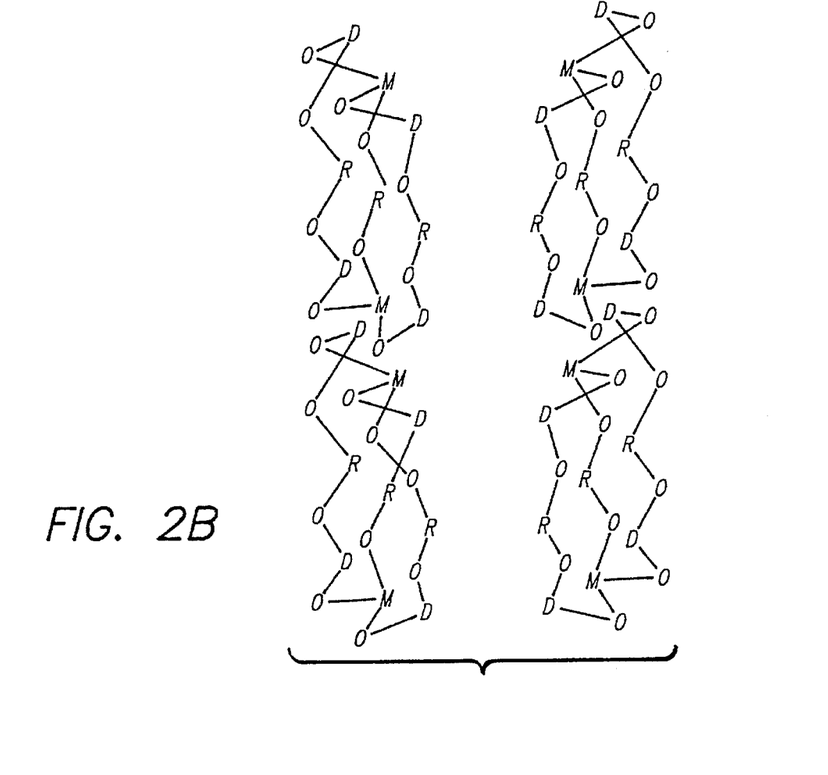
FIG. 2B is a depiction of a stacked sandwich form of ceramic superconductor.
Figure 3A:
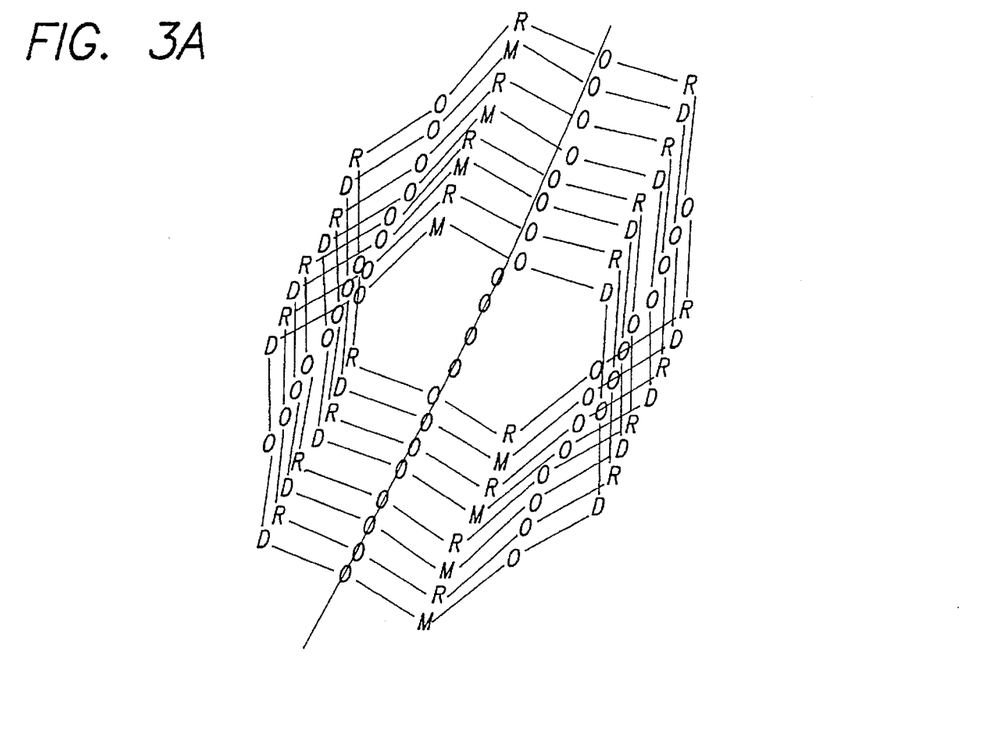
FIG. 3A is a top view, rotated 60°, of a cradle form of a ceramic superconductor.
Figure 3B:
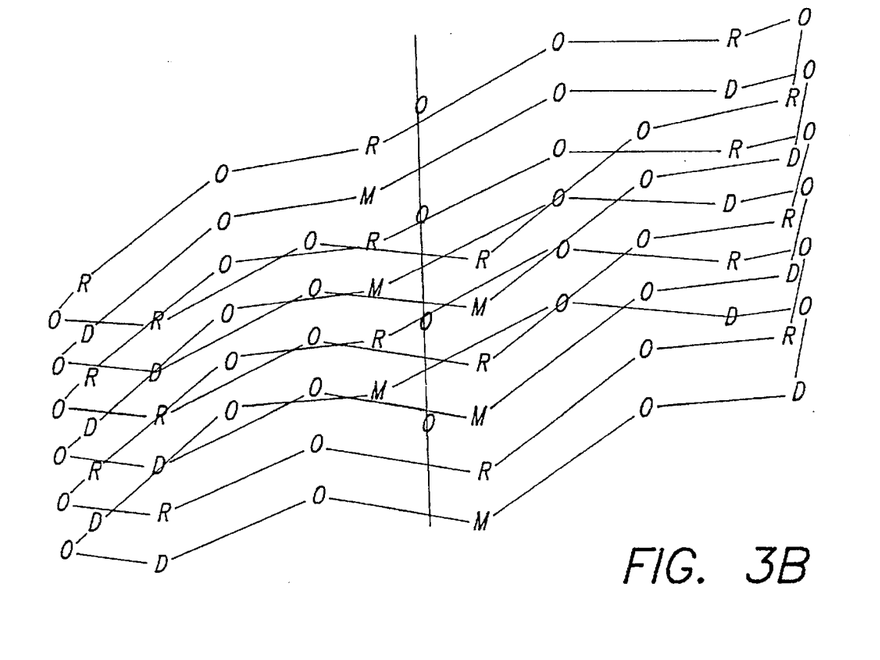
FIG. 3B is a side view of a cradle form of a ceramic superconductor.
Figure 4A:
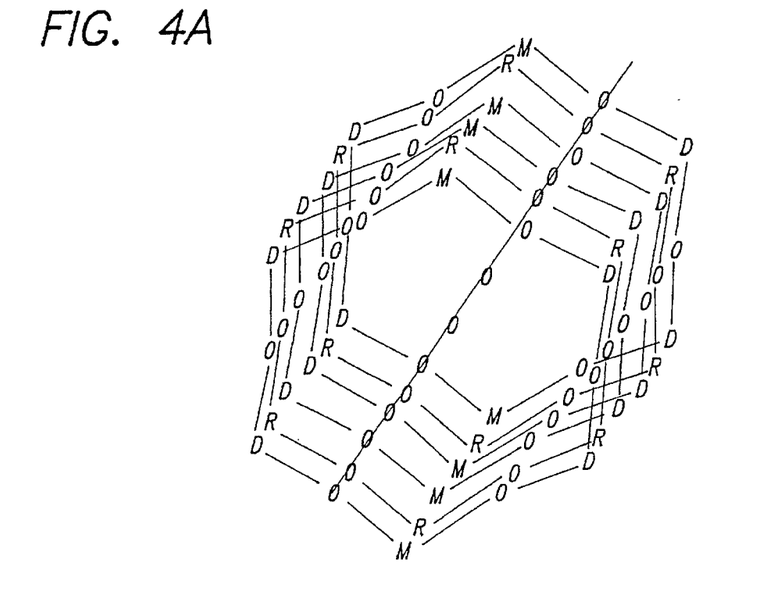
FIG. 4A is a top View, rotated 60°, of a sandwich form of a ceramic superconductor.
Figure 4B:
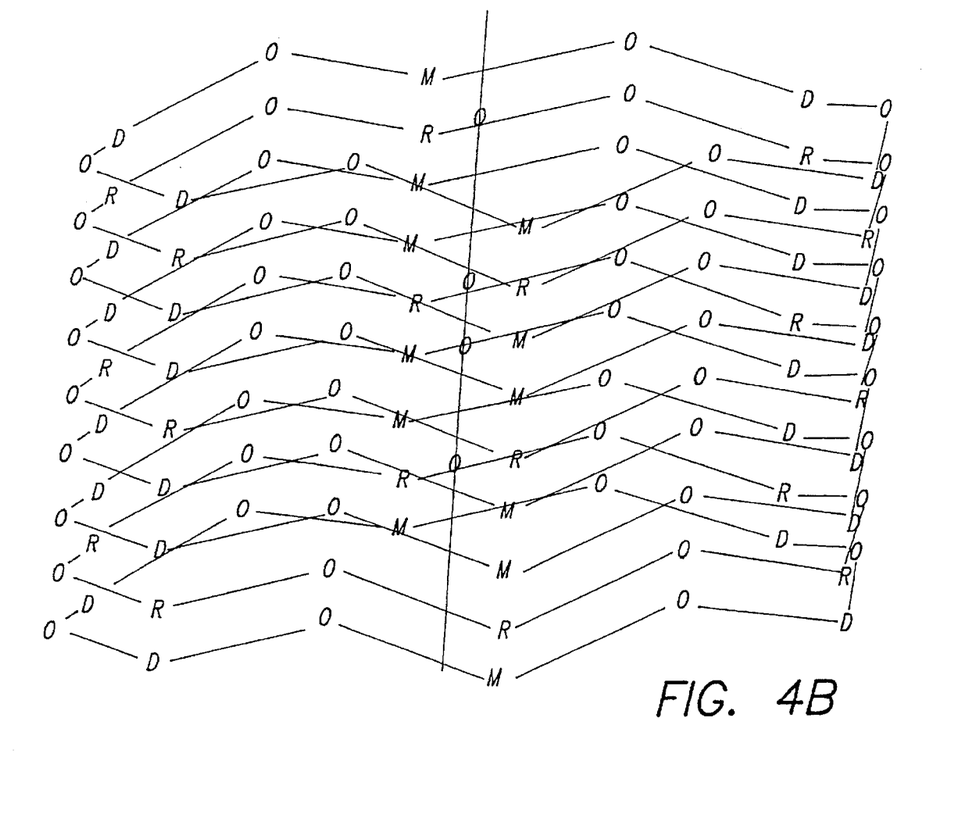
FIG. 4B is a side view of a cradle form of a ceramic superconductor.

| Sandwich Form: | | | |
|---|---|---|---|
| $Y_2$ | $Sr_4$ | xxx | $Cu_3$ |
| $Y_2$ | $Ba_4$ | xxx | $Cu_3$ |
| $Y_2$ | $Sr_2$ | $Ca_2$ | $Cu_3$ |
| $Y_2$ | $Ba_2$ | $Ca_2$ | $Cu_3$ |
| $Y_2$ | $Sr_2$ | $Ba_2$ | $Cu_3$ |
| $La_2$ | $Sr_4$ | xxx | $Cu_3$ |
| $La_2$ | $Ba_4$ | xxx | $Cu_3$ |
| $La_2$ | $Sr_2$ | $Ca_2$ | $Cu_3$ |
| $La_2$ | $Ba_2$ | $Ca_2$ | $Cu_3$ |
| $La_2$ | $Sr_2$ | $Ba_2$ | $Cu_3$ |
| $Tl_2$ | $Sr_4$ | xxx | $Cu_3$ |
| $Tl_2$ | $Ba_4$ | xxx | $Cu_3$ |
| $Tl_2$ | $Sr_2$ | $Ca_2$ | $Cu_3$ |
| $Tl_2$ | $Ba_2$ | $Ca_2$ | $Cu_3$ |
| $Tl_2$ | $Sr_2$ | $Ba_2$ | $Cu_3$ |
| $Bi_2$ | $Sr_4$ | | $Cu_3$ |
| $Bi_2$ | $Ba_4$ | | $Cu_3$ |
| $Bi_2$ | $Sr_2$ | $Ca_2$ | $Cu_3$ |
| $Bi_2$ | $Ba_2$ | $Ca_2$ | $Cu_3$ |
| $Bi_2$ | $Sr_2$ | $Ba_2$ | $Cu_3$ |

Equimolar Cradle and Sandwich Form:
(Tri-layered laminate 1-1-1-2 Form)

| Y | Sr | Sr | $Cu_2$ |
|---|---|---|---|
| Y | Sr | Ca | $Cu_2$ |
| Y | Ba | Ba | $Cu_2$ |
| Y | Ba | Ca | $Cu_2$ |
| Y | Ba | Sr | $Cu_2$ |
| Tl | Sr | Sr | $Cu_2$ |

-continued

| | | | |
|---|---|---|---|
| Tl | Sr | Ca | $Cu_2$ |
| Tl | Ba | Ba | $Cu_2$ |
| Tl | Ba | Ca | $Cu_2$ |
| Tl | Ba | Sr | $Cu_2$ |
| Bi | Sr | Sr | $Cu_2$ |
| Bi | Sr | Ca | $Cu_2$ |
| Bi | Ba | Ba | $Cu_2$ |
| Bi | Ba | Ca | $Cu_2$ |
| Bi | Ba | Sr | $Cu_2$ |
| Try-layer (2-1-1-2) Sandwich Form | | | |
| $Y_2$ | Sr | Sr | $Cu_2$ |
| $Y_2$ | Sr | Ca | $Cu_2$ |
| $Y_2$ | Sr | Ba | $Cu_2$ |
| $Y_2$ | Ba | Ba | $Cu_2$ |
| $Y_2$ | Ba | Ca | $Cu_2$ |
| $Bi_2$ | Sr | Sr | $Cu_2$ |
| $Bi_2$ | Sr | Ca | $Cu_2$ |
| $Bi_2$ | Sr | Ba | $Cu_2$ |
| $Bi_2$ | Ba | Ba | $Cu_2$ |
| $Bi_2$ | Ba | Ca | $Cu_2$ |
| Tri-layer (2-2-1-2) Sandwich Form: (with D-Metal Bridges) | | | |
| $Y_2$ | $Sr_2$ | Sr | $Cu_2$ |
| $Y_2$ | $Sr_2$ | Ca | $Cu_2$ |
| $Y_2$ | $Sr_2$ | Ba | $Cu_2$ |
| $Y_2$ | $Ba_2$ | Ba | $Cu_2$ |
| $Y_2$ | $Ba_2$ | Ca | $Cu_2$ |
| $Bi_2$ | $Sr_2$ | Sr | $Cu_2$ |
| $Bi_2$ | $Sr_2$ | Ca | $Cu_2$ |
| $Bi_2$ | $Sr_2$ | Ba | $Cu_2$ |
| $Bi_2$ | $Ba_2$ | Ba | $Cu_2$ |
| $Bi_2$ | $Ba_2$ | Ca | $Cu_2$ |
| $Tl_2$ | $Sr_2$ | Sr | $Cu_2$ |
| $Tl_2$ | $Sr_2$ | Ca | $Cu_2$ |
| $Tl_2$ | $Sr_2$ | Ba | $Cu_2$ |
| $Tl_2$ | $Ba_2$ | Ba | $Cu_2$ |
| $Tl_2$ | $Ba_2$ | Ca | $Cu_2$ |

Other superconductor materials such as Group I, (esp. Na and K) metal-intercalated buckminster fullerenes and Na and K intercalated graphite, and halogen-intercalated superconductors of the above ceramics, or any combination, thereof, can be used in the above polymer matrices to produce polymer-superconductors.

It is believed that an oxidation process causes rearrangement of bonds within the aligned layers of cradle and sandwich forms of supermolecules. Three major consequences are believed to occur: The R Metal atoms undergo subtle reorientation to produce hexagonal arrangements within planes; oxygen forms linear chains of oxygen arranged at the geometric centers of hexagonally-arranged R Metal atoms; the ceramic lattice is formed.

After hexagonal structures have been arranged in superconductive regions of ceramic masses, cooling to room temperature apparently dislocates these structures to form perovskite lattice structures at or near room temperature. It is believed that an inversion occurs when superconductors are cooled below their critical temperatures where hexagonal structures are reformed by subtle rearrangements within the lattices.

When ceramic materials are cooled to below their critical temperatures, superconductivity must occur in association with a change from paramagnetic to diamagnetic properties. It is our view that the process responsible for this change occurs within the valence shell of R Metal atoms. Viewed in terms of classical resonance theory of aromatic organic compounds, the 6 R Metal atoms of a hexagonal ring cease to contain unpaired electrons. For example, diamagnetism that can be explained in terms of Mort pairs where the free d9 electron of one valence shell can migrate to its neighbor. This classical view is, it is believed, a partial explanation but a view consistent with anyons provides a more complete picture.

It is believed that the superconductive domains of our polymers are "machines" which braid waves. Using established rules for anyons, there is reason to expect that each R Metal hexagonal ring contains 2 planes of 3 anyons, each parallel and tandem. Viewed end-on, one can see that when 3 electrons travel in an equilateral triangular arrangement in relative relationship to one another in a clockwise direction, and 3 electrons travel similarly in a counterclockwise direction, the result is the same as Mott pairing.

Since the pattern of electron movement is planar, the R Metal ring electrons will flux quantize one another and pass their magnetic energy to the only available point of transmission: electron pairs traveling as bosonic wavetrains along the linear chain of oxygens. This model provides the construct for wavetrains of electron pairs to be braided within the linear passageways of the superconductor. As the wavetrains exit superconductor domains they also loop and in the process become annihilated within the rules of anyon behavior, and it is this transformation which explains how superconductors transform energy across otherwise impermeable barriers, such as the electrically insulative polymer matricies of the present invention. It is believed that annihilated fermions can travel across polymer insulating barriers and reform as bosons within a neighboring superconductive domain as long as it is within the near vicinity of the first domain.

Accordingly, a superconductive circuit board device is provided comprising a support, electronic components and conductive lines, the lines being superconducting compositions of certain organic polymers and the components being bonded to the support and electrically connected to the conductive lines by the present compositions. The support may be of any shape, particularly since increased design freedom is afforded by not having to form laminates and successively treat layers thereof as with known circuit board devices. The polymer can define the support as well as the conductive material, for example. Thus the circuit "board" according to the invention may be viewed as a cluster of electronic components arranged in a pattern in three dimensions and connected and fixed in place with the invention polymer.

I claim:

1. The method of manufacturing a circuit board for a circuit board device comprising a support and an electronic component, including mixing superconductor ceramic particles with reactive precursors for making a thermosetting urethane or acrylic polymer to form a mixture comprising from 40 to 90% by weight superconductor ceramic particles, applying said mixture to said support in a predetermined pattern for connection with said electronic component, and curing said mixture in bonding relation with said support, said reactive precursors providing said thermoset urethane or acrylic polymer having segments which are soft and hard relative to each other for flexibility against debonding in response to expansion and contraction forces experienced during temperature transitions to and from superconducting critical temperature for said superconductor ceramic particles.

2. The method according to claim 1, including also selecting urethane polymer as said thermoset polymer.

3. The method according to claim 1, including applying said mixture from a static mixer fed from separate supplies of said reactive precursors, at least one of which contains said ceramic particles.

4. The method according to claim 1, including also forming said mixture from said precursors in a cooled and nonreactive condition and thereafter warming said precursors in said mixture.

5. The method according to claim 1, including also interposing said mixture between said support and said component, and bonding said component to said support with said mixture.

6. The method according to claim 1, including also formulating said mixture to have a viscosity to be sprayed onto said support, and spraying said mixture onto said support.

7. The method according to claim 1, including also formulating said mixture to have a viscosity to be silk-screened, and silk-screening said mixture onto said support.

8. The method according to claim 1, including also interposing said mixture between said support and said component, and bonding said component to said support with said mixture.

9. The method according to claim 1, including also defining conductive lines with said predetermined pattern of said mixture on said support for connection with said component.

10. The method according to claim 9, including also interposing said mixture between a conductive line on said support and said component to bond said component to said support and connect said component and said conductive line.

11. The method according to claim 1, including also selectively curing portions of said applied mixture and removing uncured portions thereof to define said predetermined pattern.

12. The method according to claim 1, including also selecting a light curing thermosetting urethane or acrylic polymer for said mixture, applying said mixture under conditions not effecting cure of said polymer, selectively curing said polymer by application of light into said segments which are relatively hard and relatively soft with respect to each other, and removing uncured portions thereof to define said predetermined pattern.

13. The method according to claim 1, including also applying multiple passes of said mixture atop one another according to said predetermined pattern to define thick-film circuitry.

* * * * *